United States Patent [19]

Farrer

[11] 3,820,039

[45] June 25, 1974

[54] ELECTRICALLY TUNABLE TUNED LINE OSCILLATOR

[75] Inventor: Leland M. Farrer, San Jose, Calif.

[73] Assignee: Systron Donner Corporation, Concord, Calif.

[22] Filed: Nov. 2, 1972

[21] Appl. No.: 303,280

[52] U.S. Cl. ............ 331/99, 331/107 G, 331/177 V
[51] Int. Cl. ............................................ H03b 7/14
[58] Field of Search ............ 331/96, 99, 101, 107 R, 331/107 G, 177 V

[56] References Cited

UNITED STATES PATENTS 3,711,792 1/1973 Kaneko et al.............. 331/107 G X

OTHER PUBLICATIONS

Wilson et al., "Development of an FM Pulsed Gunn Oscillator at X Band," IEEE Transactions on Electron Devices, July 1971, p. 450.

Ivanek et al., "Investigation of Waveguide-Below--Cutoff Rosonators For Solid-State Active Devices," Electronics Letters, 15 May 1969, pp. 214–216.

*Primary Examiner*—Herman Karl Saalbach
*Assistant Examiner*—Siegfried H. Grimm
*Attorney, Agent, or Firm*—Flehr, Hohbach, Test, Albritton & Herbert

[57] ABSTRACT

The disclosed embodiment of the present invention is a voltage tunable oscillator which includes a pair of tuning lines mounted transversely in a transmission line structure in parallel relationship to one another. One tuning line includes a Gunn diode and an inductive line section mounted in series with one another between opposite walls of the transmission line structure. The other tuning line includes a varactor diode and an inductive line section mounted in series with one another between opposite walls of the transmission line structure. The Gunn diode and varactor diode are mounted on opposite walls of the transmission line structure from one another. Suitable bias voltage is supplied to the Gunn diode and varactor diode. The spacing between the tuning lines is substantially less than the spacing from each line to a wall of the transmission line structure which is parallel thereto. Accordingly, the tuning range of the oscillator is determined primarily by the distance between the tuning lines.

7 Claims, 4 Drawing Figures

ELECTRICALLY TUNABLE TUNED LINE OSCILLATOR

BACKGROUND OF THE INVENTION

This invention relates generally to oscillators and more particularly to a tunable oscillator having a tuning range which can be controlled or established independently of the parameters of any active or control impedance elements therein.

The frequency of operation and the tuning range of presently known oscillators are primarily established by the impedances presented by the active and control elements therein. Examples of such oscillators are disclosed in U.S. Pat. Nos. 3,377,568 and 3,397,365. Since the impedance of these elements is influenced by cavity effects and other physical factors, empirical data and knowledge has been required to design an oscillator having a particular frequency of operation and tuning range. It has, therefore, been necessary in the past to construct an actual physical embodiment of an oscillator before its operating parameters could be accurately determined. Accordingly, the frequency of operation and tuning range of such oscillators could not be accurately predicted without experimentation and trial-and-error techniques.

U.S. Pat. No. 3,599,118 discloses several embodiments of voltage tunable oscillators. The frequencies of operation and tuning ranges of such oscillators can be altered by combining impedance in various configurations or by removing one or more line sections. However, such changes in the physical structure of such oscillators can not be effected without altering the operating parameters significantly.

The voltage tuned oscillator comprises a plurality of parallel tuning lines disposed transversely within a transmission line structure. One of the tuning lines includes an active element and another of the tuning lines includes a variable impedance element. Means control the impedance of the variable impedance element and means coupled to one of the tuning lines remove a generated signal.

It is an object of this invention to provide a tunable oscillator having a tuning range which is independent of any active or control impedance elements therein.

It is another object of the present invention to provide a tunable oscillator having a tuning range which can be selected by altering the dimensions between line sections therein.

These and other objects are attained by the provision of a controllable variable impedance element in a first line section extending transversely in a transmission line and an active power generation element in a second line section parallel to the first line section. The two line sections form a parallel tuned circuit and the operating parameters of such an oscillator are determined by the physical dimensions of the line sections and their relative spacing.

A feature of the present invention resides in the provision of such an arrangement of parallel lines in which the tuning range thereof can be altered by changing the relative spacing of the lines. More specifically, the tuning range is decreased in such an arrangement as the distance between the line sections is increased. The physical dimensions of such line sections determine their characteristic impedances and, therefore, the frequency of operation of the oscillator.

It can be readily appreciated that the oscillator structure of the present invention has a distinct advantage over prior known oscillators in that its frequency of operation and tuning range can be controlled independently of the active and control impedance elements therein.

These and other objects, features and advantages of the present invention will be more fully realized and understood from the following detailed description, when taken in conjunction with the accompanying drawings.

DESCRIPTION OF THE PREFERRED EMBODIMENT

Figures 1, 2:
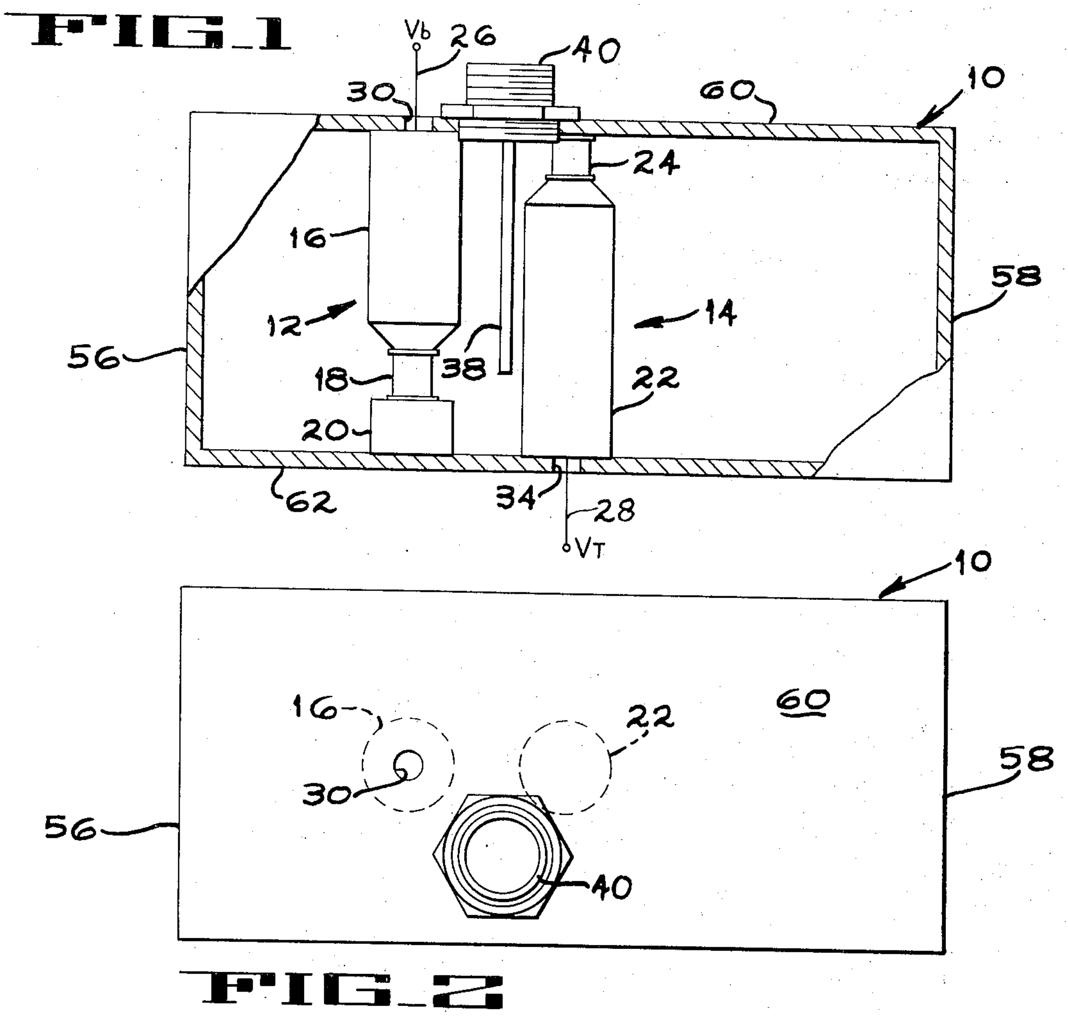
FIG. 1 is a plan view, partially diagrammatic and partially broken away, of a voltage tuned oscillator constructed in accordance with the principles of the present invention.
FIG. 2 is a top view in reduced scale of the oscillator illustrated in FIG. 1.

Like reference numerals throughout the various views of the drawing are intended to designate the same components.

With particular reference to FIG. 1, there is shown a tunable oscillator circuit constructed in accordance with the principles of the present invention, which generally comprises a hollow rectangular transmission line structure 10 made of a suitable conducting material to serve as the outer conductor of a TEM mode transmission line. The transmission line structure 10 is shown in the form of a rectangular housing or cavity which is disposed for supporting a pair of parallel tuning lines 12 and 14 mounted transversely therein between opposite walls thereof. The tuning line 12 includes a line section 16 in the form of an inductive metallic rod insulated from structure 10 and a Gunn diode 18. One end of the line section 16 is mounted on an inner surface of the housing 10 and the Gunn diode 18 is mounted at the other end thereof. It is to be understood, however, that any active two-terminal power generation device may be employed in place of the Gunn diode 18. The Gunn diode 18 is electrically connected to a wall of the housing 10 through a block of conductive material 20.

The tuning line 14 includes a line section 22 in the form of an inductive metallic rod. One end of the line section 22 is mounted on an inner surface of and insulated from the housing 10 and a controllable, variable impedance device 24, such as a varactor diode, is mounted between the other end thereof and an inner surface of the housing 10. Bias voltage $V_b$ is supplied to the Gunn diode 18 via a line which is illustrated diagrammatically by line 26. Similarly, bias voltage $V_T$ is supplied by line 28. Line 26 extends through an aperture 30 in housing 10 to one end of the line section 16 and effectively forms a bypass capacitor 32 with the housing 10 (see FIGS. 3 and 4). The line 28 extends through an aperture 34 to one end of the line section 22 and effectively forms a bypass capacitor 36. Power is removed from the oscillator by means of a coupling probe 38 which extends into the cavity from a connector 40 mounted in a wall of the housing 10. The coupling probe 38 effectively couples power out of the circuit from the tuning line 14 through an effective capacitance therebetween which is shown schematically in FIGS. 3 and 4 as a capacitor 42.

Figure 3:
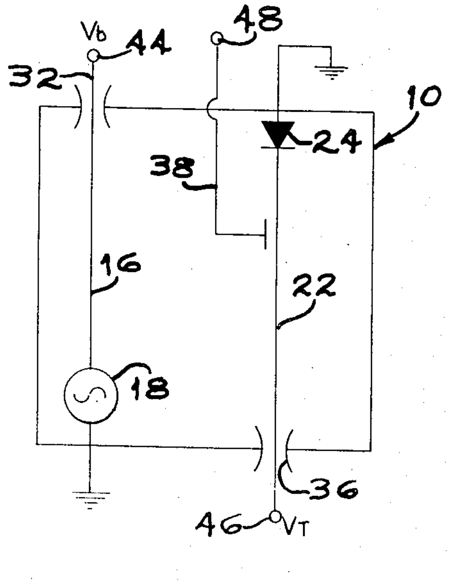
FIG. 3 is a schematic model representation of the oscillator illustrated in FIG. 1.

FIG. 3 is a diagrammatic representation of the oscillator structure illustrated in FIG. 1. As shown therein, bias voltage $V_b$ is supplied via a terminal 44 to the Gunn diode 18. The housing 10 is maintained at ground potential and the other end of the Gunn diode 18 is connected thereto. The voltage on the terminal 44 is coupled to ground potential via the bypass capacitor 32. Bias voltage $V_T$ is supplied to the varactor diode 24 via a terminal 46 which is coupled to ground potential by means of the bypass capacitor 36. The anode of the varactor diode 24 is connected to the housing 10 and is, therefore, maintained at ground potential. The coupling probe 38 is coupled to the varactor tuning line via the capacitor 42 and supplies an output on a terminal 48.

Figure 4:
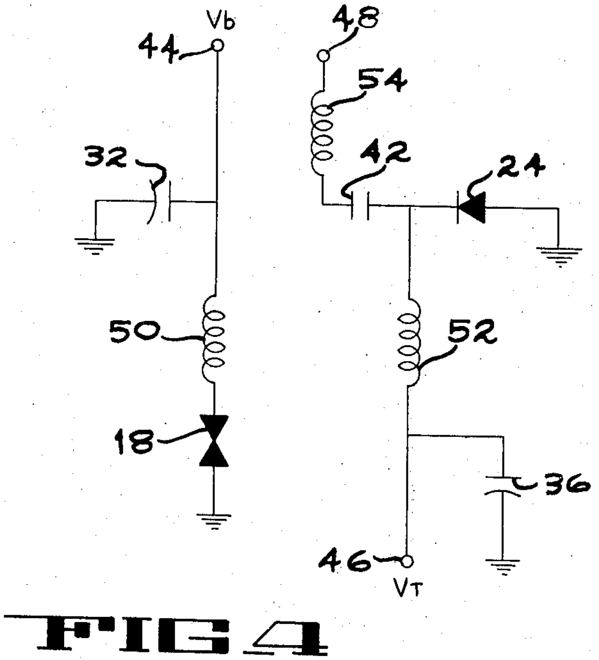
FIG. 4 is a schematic diagram of an equivalent electrical circuit of the oscillator illustrated in FIG. 1.

FIG. 4 illustrates an equivalent circuit diagram of the oscillator illustrated in FIG. 1, with the exception of the reactances presented by the Gunn diode 18 and the varactor diode 24, which reactances are well known. The line section 16 effectively forms an inductive reactance represented by the inductor 50. The line section 22 effectively forms an inductive reactance which is represented by the inductor 52. The inductance of the coupling probe is represented by an inductor 54 connected between the terminal 48 and the capacitor 42. It can be readily appreciated from the FIG. 4 that a parallel circuit is formed by the diodes and inductors having a particular operating frequency and tuning range. The circuit is tuned by controlling the voltage $V_T$ to change the bias on the varactor diode 24. As is well known, a varactor diode presents a capacitive effect in the circuit, the value of which changes in accordance with the bias supplied thereto. The Gunn diode 18 is biased into the negative resistance region of its operation characteristics by the voltage $V_b$.

It can be readily appreciated from FIG. 4 that the operating frequency of the oscillator can be controlled by the value of the inductances 50 and 52. Such inductive values are proportional to the diameters of the line sections 16 and 22, respectively. Accordingly, the operating frequency of the oscillator can be selected by changing the dimensions of the line sections 16 and 22.

The tuning range of the oscillator of the present invention can be altered by changing the spacing between the line sections 16 and 22. From the schematic diagram illustrated FIG. 4, it can be readily appreciated that such a change alters the coupling between the varactor diode and the Gunn diode.

In a typical example of the present invention, a tuning range of 4.4 gigahertz to 5.05 gigahertz was obtained by biasing the varactor diode from a voltage of 3.8 volts to 5.6 volts, respectively, with the following dimensions for the structural elements:

| | |
|---|---|
| Distance between walls 56 and 58 | 1.115 inches |
| Distance between walls 60 and 62 | 0.400 inch |
| Length of line section 16 | 0.280 inch |
| Diameter of line section 16 | 0.160 inch |
| Length of line section 22 | 0.335 inch |
| Diameter of line section 22 | 0.225 inch |
| Distance from centerline through line section 16 to wall 56 | 0.340 inch |
| Distance from centerline through line section 22 to wall 56 | 0.557 inch |
| Width of housing 10 (FIG. 2) | 0.740 inch |

-Continued

In the above example, the line sections 16 and 22 are spaced midway across the width of the housing 10 and the coupling probe 38 is positioned as shown in FIG. 1. The relative spacing of the coupling probe 38 with respect to the line section 22 alters the capacitive coupling therewith and the effective power which can be withdrawn from the oscillator.

In addition to the advantages mentioned hereinabove, the oscillator of the present invention serves to reduce noise occurring near the carrier frequency, when compared with other oscillators.

I claim:

1. An electrically tunable oscillator comprising a. a walled transmission line structure having a space extending longitudinally therethrough;

b. first and second tuning lines mounted in parallel relation to one another and transversely within the space of said transmission line structure, one of said tuning lines including an active element and the other of said tuning lines including a variable impedance element, c. voltage means for controlling the impedance of said impedance element, additional voltage means for supplying a voltage to said active element, and d. means coupled to one of said tuning lines for removing a generated signal, said first and second tuning lines forming a tuned circuit with an operating oscillation which is adjustable over a predetermined tuning range by controlling the voltage means controlling the impedance of the impedance element.

2. A tunable oscillator as defined in claim 1, wherein each of said tuning lines includes a line section forming an inductance coupled to the transmission line structure, said first tuning line having an active element coupled at one end thereof to said transmission line structure and at the other end thereof to one end of the associated line section, said second tuning line having a variable impedance element coupled at one end thereof to said transmission line structure and at the other end thereof to one end of the associated line section.

3. A tunable oscillator as defined in claim 2 wherein said active element is mounted on one side of said transmission line structure and said variable impedance element is mounted on an opposite side of said transmission line structure.

4. A tunable oscillator as defined in claim 3 wherein said line sections have an elongate cylindrical configuration.

5. A tunable oscillator as defined in claim 3 wherein the spacing between line sections is substantially less than the spacing of each line section to a wall of said transmission line structure which is parallel to said line section.

6. A tunable oscillator as defined in claim 5 wherein the tuning range is determined by the relative spacing between said first and second tuning lines.

7. A tunable oscillator as defined in claim 1 wherein said active element is a Gunn diode and said variable impedance element is a varactor diode.

* * * * *